United States Patent [19]

Hetzel

[11] B 3,914,719

[45] Oct. 21, 1975

[54] BAND-PASS FILTER AND METHOD OF MAKING SAME

[75] Inventor: Max Hetzel, Bienne, Switzerland

[73] Assignee: Elresor SA, Bienne, Switzerland

[22] Filed: June 4, 1973

[21] Appl. No.: 366,589

[44] Published under the Trial Voluntary Protest Program on January 28, 1975 as document no. B 366,589.

[30] Foreign Application Priority Data

June 12, 1972 Switzerland ........................ 8685/72

[52] U.S. Cl. ........................ 333/71; 29/594; 310/25

[51] Int. Cl.$^2$. H03H 9/02; H03H 9/26; H02K 35/00

[58] Field of Search ........ 333/71, 30 R; 331/116 M, 331/156; 310/25, 36; 29/594

[56] References Cited

UNITED STATES PATENTS

| | | | |
|---|---|---|---|
| 3,621,467 | 11/1971 | Dostal | 331/156 X |
| 3,659,230 | 4/1972 | Tanaka et al. | 333/71 |
| 3,710,275 | 1/1973 | Tanaka et al. | 331/156 |
| 3,759,133 | 9/1973 | Budych et al. | 331/156 X |

*Primary Examiner*—James W. Lawrence
*Assistant Examiner*—Marvin Nussbaum
*Attorney, Agent, or Firm*—Griffin, Branigan and Butler

[57] ABSTRACT

A band-pass filter comprises a resonator system having a first and a second resonator coupled together by a coupling mass resiliently suspended on supporting means, the first resonator being associated with an electrodynamic transducer capable of converting an input signal into oscillation energy, and the second resonator being associated with an electrodynamic transducer capable of generating an output signal corresponding to the oscillating condition of said second resonator.

27 Claims, 8 Drawing Figures

BAND-PASS FILTER AND METHOD OF MAKING SAME

On a prior art electromechanical filter two tongue resonators are mounted on a mass and coupled together by a spring. Electromagnetic transducers are provided at the filter input and at the filter output. In order that this filter not be subject to outside influences, the mass, on which the tongue resonators are mounted, must be very large. If this is not the case, the natural frequencies of the tongues are not fully defined. Depending on whether the filter is mounted on a hard or a soft base there will be differences in the pass frequency. Also, any external vibrations will be sufficient to cause trouble. The prior art filter is also unstable. As the coupling takes place by means of electromagnetic transducers, a negative magnetic elasticity is present because of the polarisation. This, however, shifts the frequency of the band-pass filter.

On practically all mechanical band-filters the relative band-width is small. The bandwidth lies in the order of one to two percent of the frequency. By the use of electromagnetic transducers, bandwidths 3% of the frequency have been obtained, but this has required that the already described instability be taken into consideration. However, instability makes such a mechanical band-filter unsuitable for certain applications.

Attempts have been made to give a tuning fork filter a larger pass region, while retaining the steepness of the frequency response curve. Such a filter would have a wider field of application. This filter makes use of the fact that every tuning fork has two resonant frequencies. To increase the pass-band of a tuning fork filter, use is made of the fact that both resonance frequencies of a tuning fork are located close to each other, so that a common pass curve results, this curve being naturally substantially wider than the pass curve of the usual tuning fork filter on which only a resonance frequency corresponding to the natural frequency is used. For this purpose two tines acting as resonators are coupled by a coupling mass and the whole is suspended on two springs in a frame. In this way the two resonant frequencies will lie closer to each other, the larger the mass is which couples the tines together. For each resonator an electromagnetic transducer is provided which consists of a stationary horseshoe core having two coils. The magnetic circuit of this transducer is closed by the resonators consisting of a magnetisable or magnetised material, as disclosed in German Pat. No. 892,344.

However, as the stationary portion of each transducer is not mounted on the mass coupling the two resonators, difficulties occur on adjusting the air gaps, and later on, in the operation of the filter. Because of the relatively resilient suspension of the coupling mass, changes in the air gap may occur, so that the input and output impedances may be subjected to substantial changes, and the band-pass curve may be unfavorably influenced.

For these reasons it is necessary to provide relatively large air gaps on the described prior art filter. This again results in such a low electromechanical coupling factor of the transducer that only a filter with a very small bandwidth is obtained. A further serious disadvantage of the prior art filter is that the damping curve will not reach an infinite value on low frequencies, but will have a fixed value for zero frequency, i.e. DC-current. This makes it necessary to switch an electric band-pass filter in series with the electromechanical filter to block low frequencies. This, however, results in a substantial cost increase and further results in increased dimensions of the filter. This again, would make it impossible to use the filter for applications where small dimensions are desirable. A further disadvantage of the prior art filter exists in that the mass coupling the resonators is relatively far away from the motion line of the dynamic centers of gravity of the two resonators. Accordingly, for a desired relative bandwidth the coupling mass must be relatively large. This again, will make it impossible to obtain for the prior art filter a compact and lightweight design.

It is object of the invention to provide a band-pass filter which is small, easy to manufacture, and cheap, and which has, particularily in the lower low frequency region, the desired bandwidth and is in addition stable, relatively free of losses and has a high quality factor.

According to the invention this object is obtained in that on a filter of the kind described above, the other part of each transducer is connected to the coupling mass and forms a part thereof.

On the filter according to the invention said other part of the transducer is not mounted on the means for resiliently suspending the coupling mass, but is mounted at the coupling mass itself, so that no undesirable air gap changes can occur in operation. Accordingly, also the input and output impedances will not change, so that the band-pass curve will remain stable. A further advantage of the inventive filter consists in that, because of the location of the other part, the respective air gap between the two parts of each transducer will be very small and can also be kept within very narrow limits. Small air gaps on transducers result in a strong increase of the electromechanical coupling factor, which again permits a substantially larger bandwidth. For a good filter it is of importance that it can be adjusted to the desired band-pass damping by means of electric terminal resistances, because otherwise the undesired ripple occurs in the pass-range. Thanks to the mounting of said other part of each transducer to the coupling mass, the damping curve of the filter will move to an infinitely high value on low frequencies. This has the advantage that additional electrical filters are not required.

Mass coupling of the resonator provides that the bandwidth of the pass-band of the filter is a function of the ratio of two masses of the resonator system. Therefore, on manufacturing, this bandwidth can be obtained very accurately, and it is also stable. Further, the band-pass filter according to the invention has also a very high quality factor, which makes its application in many cases interesting, particularly on low frequencies, where conventional filters very often have a low quality factor and are expensive.

In contrast to electrical band-pass filters which have a low quality factor in the lower low frequency region, which low quality factor may be too low for filter purposes, the present band-pass filter has a very high quality factor. This permits a particularly good selectivity, so that the band-pass filter is particularly well suitable for the filtering of low frequency signals from a frequency mixture of high noise level or high external voltage level as is, for instance, the case on remote control systems. It must also be stressed that the present band-pass filter has very low losses on frequencies in the band-pass region of the band-filter curve and is easily adapted to different systems, particularly electrical systems. As the coupling mass is resiliently suspended, vibrations will not unfavorably influence the band-pass filter.

According to a preferred embodiment of the invention, the part of the transducer which is mounted on the coupling mass is the coil section of an electrodynamic transducer. As the coupling mass vibrates only slightly, the connections to the coils of the electrodynamic transducer can easily be fed to the outside. A further advantage consists also in that, when the coil member is mounted on the coupling mass, the magnetic part can be located at the resonator. The magnetic part constitutes a substantially more stable element than a coil and is therefore not easily subject to changes, so that the natural frequency of the resonator remains stable.

According to a further embodiment of the invention a large part or most of the coupling mass is located near the line connecting the oscillation centers of gravity of the resonators. This has an advantage in that the filter can be designed very compactly and with light weight. On a relative bandwidth of, for instance, 1 to 200, the smallest coupling mass will, on a resonator oscillating mass of one gram, amount to only about 200 gr, if it is located near said line. If, however, the coupling mass is not concentrated on said line, as is the case on prior art filters, the coupling mass could easily reach values of one kilogram and more. In contrast to this an embodiment of the invention for the preferred field of application, i.e. the lower low frequency region, has dimensions of only a few centimeters. A comparable electric band filter for the same frequency, if it could be realized, would have inductivities on very large cores, and comprise condensers of large volume, so that the electrical filter would be several times larger in its outside dimensions than the described electromechanical band-pass filter.

According to an embodiment of the invention the resonators are mechanically coupled. Even if other rigid couplings are imaginable, a mechanical coupling is the simplest and cheapest coupling.

According to one embodiment of the invention, one or both of the resonators may comprise a spring element connected at one end at the resiliently suspended coupling mass and carrying at the other end an oscillating mass. In this way a very simple and easily tuned resonator system is created.

According to a further embodiment of the invention, the spring element is a leaf spring. The leaf spring can oscillate only in a single plane because for a corresponding ratio between thickness and width it is stiffer in one direction than in the other direction. This can be of advantage if the end mass carried by the leaf spring, as is the case on one embodiment, comprises a magnetic system forming the moving part of an electrodynamic transducer. This movable part should be capable of being moved always in the same path relative to the stationary part of the transducer, and should in no case touch the stationary part. According to an advantageous embodiment of the invention the magnet system is located laterally at the free end of the leaf spring, and at the point where it leaves the magnetic system, the magnetic path is practically vertical relative to the oscillation plane of the leaf spring. Since the leaf spring, as has already been described, is stiff vertically with repsect to the oscillation plane, the magnet system cannot be drawn into a coil of the transducer, the axis of which is located vertically with respect to the oscillation plane of the leaf spring. This enables a particularly suitable design of the transducer.

Prior art band-pass-filters are normally tuned by changing the oscillating mass of the resonators. For this purpose, the oscillating mass is reduced by filing off, or increased by depositing soldering tin. Such a tuning method requires much skill and is highly time consuming. Of particular disadvantage is the fact that, during the tuning operation the system cannot oscillate, and that there is a danger of soiling the transducer by molten or filed off material. In particular, magnetic material is attracted by the magnetic field of the transducer and retained thereby. Such parts of material can lead later on to undesirable troubles in operation, if they are not discovered and removed during the necessary controls.

It is therefore a further object of the invention to provide a method of manufacturing which avoids the above mentioned disadvantages. According to the invention this is obtained in that, for tuning the band-pass-filter to the desired frequency of a predetermined bandwidth, the complete band-pass-filter is held at its coupling mass, and the cross-section of one or the other leaf spring, respectively, when said leaf spring is operated by the associated transducer as an oscillator, is reduced at one location until the lower band-pass-frequency is obtained by the respective resonator.

This method makes it possible to manufacture all band-pass-filters for a certain frequency range with the same elements, whereupon the desired frequency can later on be obtained in a simple way by the described tuning. An important advantage of the described method of tuning is that tuning can take place with continuously oscillating resonators. This enables a particularly fast and exact tuning. As it is not necessary to file off material from the oscillating end mass, which is formed by a permanent magnet system, there is no danger that file dust will remain attached in the magnetic field of the transducer. Accordingly, it is not necessary to continuously clean the transducer during tuning. While an embodiment of the invention provides that reducing the cross-section of the leaf spring takes place by a material removing operation which also causes dust, the reducing of the cross-section of the leaf spring takes place near its mounting at the normally suspended coupling mass, which is then held rigidly. This has the advantage that the dust does not occur in the immediate proximity of the transducer and therefore can easily be removed by suction.

The present invention relates also to a special use of the described band-pass filter, namely for remote control receivers for selectively filtering a remote control signal from the power line frequency.

Where different apparatus, sensors, control devices etc. must be controlled and supervised from a central location, this is usually done by means of information channels which, in order to increase the number of possibilities of control, are usually controlled by time multiplex systems. To each information channel a frequency band is assigned, the information of which can be filtered out by respective band-pass filters.

The number of channels depends very much on the filters used for separating the channels. When the control commands run over discrete frequencies to the different receivers, band-pass filters with an optimum steep edge must be used. Depending on the expenses electric band-pass filters can be built with sufficient success. However, a special problem arises when, in the sense of an optimal use of the total spectrum available, the low frequency regions should be used for transmissions. Particularly, in the lower part of the low frequency region, that is in the region of approximately 100 to 1000 hertz, electric filters become large and expensive. However, this is the region particularly suitable for the transmission of control signals on the power mains, because in this region the control signals are damped very little by transformers.

Furthermore, it is not possible to obtain high Q factors with electric band-pass filters. Therefore, because of bad selectivity it was, until now, not practically possible to use the lower region of the frequency spectrum, or it was used only insufficiently. If control signals must be transmitted on the power mains (so-called central remote control), the problem of safety from troubles is posed in particular at transmission frequencies in the region of the harmonic frequency of the power line frequency.

Therefore, according to a further aspect of the present invention the application of the band-pass filter on remote control receivers for selective filtering of the remote control signal from the power line frequency is provided. The inventive filter is particularly suited for this purpose, because, compared with pure electrical band-pass filters, it can be made small and can be economically manufactured, and it further has the already mentioned outstanding qualities of high Q-factor, high efficiency and a relatively large bandwidth with steep flanks which facilitates filtering of the harmonic frequency of the power line frequency. Due to the high Q-factor and the resulting good selectivity, the different transmission frequencies in remote control systems can be used close to each other. In addition, transmission frequencies near the harmonic of the power line frequency do not pose problems. The relatively high bandwidth makes it possible to obtain at the receiver the total bandwidth of the remote control signal, thus increasing the information rate. The utilization of the total bandwidth is further assured by the very high frequency stability of mechanical resonators over large temperature ranges and large time intervals.

Other objects of the invention, its mode of operation, and its method of manufacture will be better understood upon consideration of the following description and the accompanying drawing wherein.

Figures 1, 2:
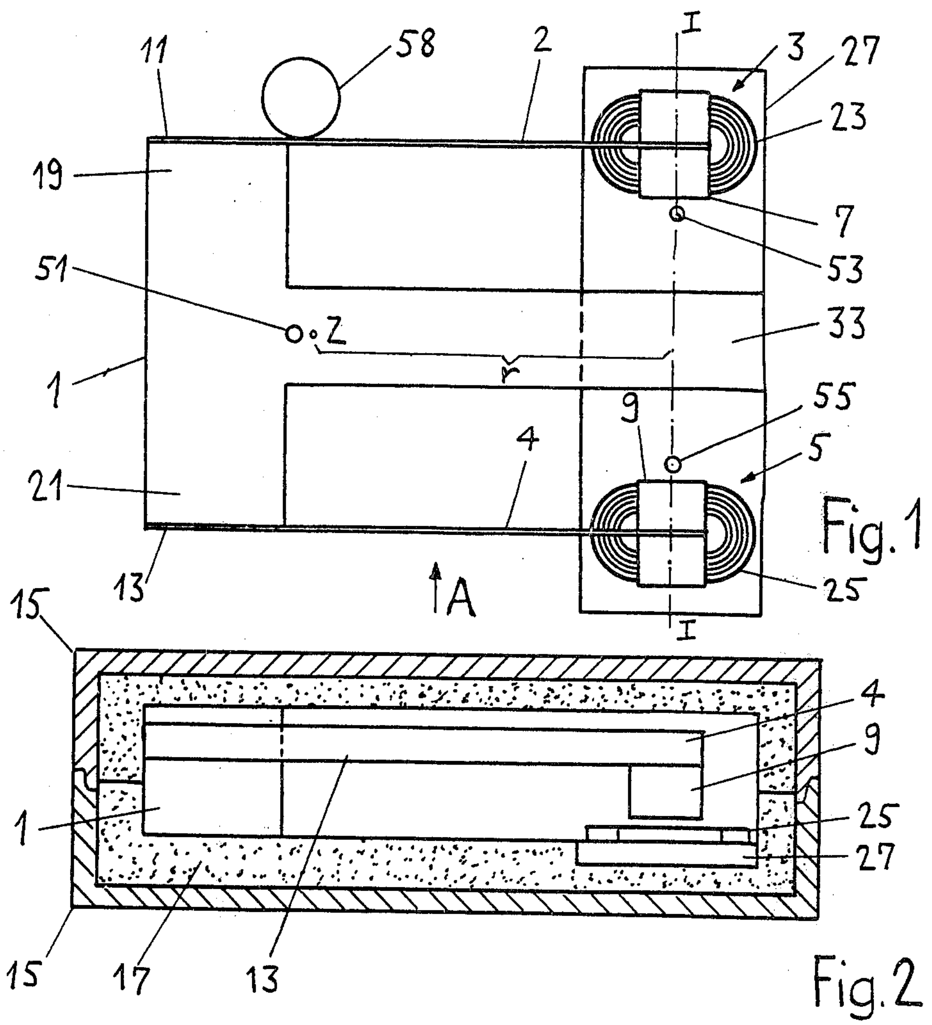
FIG. 1 shows a view of an embodiment of the electromagnetic resonator system of the band-pass filter, the electromagnetic resonator system comprising electrodynamic transducers.
FIG. 2 is a sectional view of a system like that of FIG. 1, but showing suspension in a housing by using cushions of foam materials.

The electromechanical band-pass filter shown in FIGS. 1 and 2 represents a preferred embodiment of the invention. One can imagine a number of other embodiments of an electromechanical band-pass filter constructed according to the principles of the present invention. Therefore, the subject of the invention will be considered below with reference to an electric analogy model, and special weight will be attached to characterize the necessary elements required to obtain the desired functions.

The electromechanical band-pass filter shown in FIGS. 1 and 2 comprises a resonator system with two mechanical resonators, 2 and 4. The resonators 2 and 4 are connected together by a resiliently suspended mass (mass M), this mass M comprising a base member 1 and the parts rigidly connected therewith. The exitation of the resonator system with the resonators 2 and 4 occurs at the filter input, preferably by means of a dynamic transducer 3 acting on the resonator 2. By means of the already mentioned coupling over the mass of the base member 1, the resonator 2 acts on the resonator 4.

The oscillation energy of the resonator 4 indirectly exited by the resonator 2 can be obtained at the filter output by means of a further electrodynamic transducer 5. Accordingly, a two-port or quadripole is present. It can be remarked in this respect that it is of no importance which resonator, 2 or 4, is used as the input resonator, if the input and the output impedance are of the same magnitude.

It is basically possible to adapt the pure mechanical resonator system of the two-port to other systems, e.g. mechanical, optical or thermic systems by means of suitable transducers. For use in electric circuits the adaption is preferably accomplished by means of electrodynamic transducers. In this case the filter can be switched directly into electric circuits, and can also be described and used with respect to its characteristics, as an electric filter. Electrodynamic transducers do not have negative magnetic elasticity shifting the frequency. Accordingly, the band-pass filter is highly stable.

Magnetic systems 7 and 9, which are preferably permanent magnets, are parts of the electrodynamic transducers 3 and 5 and of the resonators 2 and 4. The magnetic systems 7 and 9 are connected at the end of the spring elements 11 and 13, respectively, which are preferably formed as leaf springs. The magnet systems 7 and 9, with their mass and the mass of the spring elements 11 and 13, constitute the oscillating masses of the resonators 2 and 4. The spring elements 11 and 13 form the resilient component. The resonators 2 and 4 comprise spring elements 11 and 13, respectively, and a terminal mass, which has preferably the form of magnet systems 7 and 9, respectively. In the condition of harmonic oscillation of resonator 2 and 4, the energy moves periodically back and forth between the spring element in the tensioned or flexed state, and the accelerated mass (magnet system and mass of the spring element).

The base member 1 to which the resonators 2 and 4 are mounted, is also a part of the accelerated mass. In order to enable the base member 1 to participate in oscillation, it is relatively freely movably suspended in the housing 15, as illustrated in FIG. 2. This suspension is preferably by means of cushions 17 of sponge rubber or foam materials. It is also possible to suspend the base member 1 in another way, as subsequently described. As already mentioned, the base member 1 serves to transmit the oscillation energy of one resonator to the other resonator. If the whole is considered, a coupled resonating system is present in which the resonators 2 and 4 cannot oscillate freely, but make, because of the mass coupling, oscillations which are in a certain way forced. This explains the special characteristics of the band-pass filter.

If the electromechanical band-pass filter is excited by a continuous frequency spectrum, for instance by means of the electrodynamic transducer 3, only frequencies of a relatively small region of the total spectrum will show up at the output of the band-pass filter, that is at the electrodynamic transducer 5 (or vice versa). Accordingly, a band-pass filter is present, the characteristics of which shall now be determined by transformation into electric analogy.

The analogies consist in respect to the mathematical relation of force K and velocity V on one hand, and current I and voltage U on the other hand. The relationship is given by the law of induction and the law of Ampere. One obtains the following analogies:

| | | |
|---|---|---|
| | V | U |
| | K | I |
| mass | m | capacity C |
| elasticity | E | inductivity L |

Figure 4:
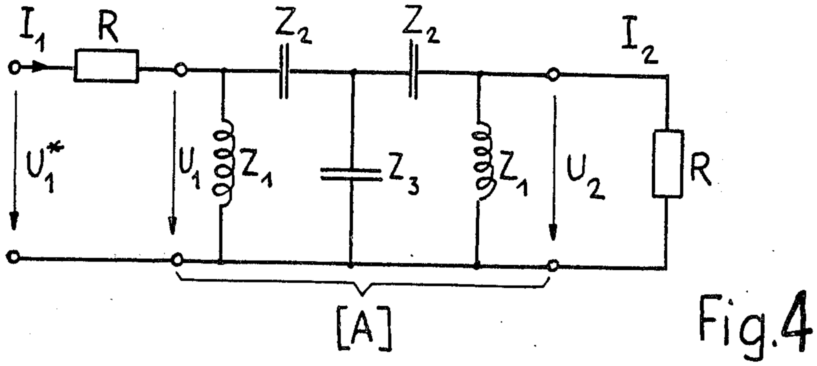
FIG. 4 shows the electric equivalent circuit diagram of the electromechanical resonator system.

Therewith, the inventive mechanical filter can be described in terms of its electrical equivalent, the equivalent being of the form shown in FIG. 4. The individual branches of the network contain the electrical reactances $Z_1$, $Z_2$, $z_3$ in form of inductances L and capacitances C.

The resistances R represent the external circuits and lines adapted by the electrodynamic transducers considered as ideal.

The special characteristics of this electrical network correspond to the characteristics of the mechanical system and are therefore described by the same mathematical expressions.

On a filter of this kind it is the transfer function which is of interest. It is generally complex and indicates the damping and phase relation. The transfer function can be obtained by solving the network equations on the basis of Kirchhoff's current and voltage laws or generally by stating and utilizing the quadripole substituion matrix.

The simplest way is to compute with an [A]- matrix, because this matrix can easily be obtained by a ladder network of impedance quadripoles. It relates input and output of a quadripole in the following way:

$$\begin{bmatrix} U_1 \\ I_1 \end{bmatrix} = \begin{bmatrix} A \end{bmatrix} \cdot \begin{bmatrix} U_2 \\ I_2 \end{bmatrix},$$

whereby $$\begin{bmatrix} A \end{bmatrix} = \begin{bmatrix} a_{11} & a_{12} \\ a_{21} & a_{22} \end{bmatrix}$$

and $a_{11}$–$a_{22}$ are coefficients of the matrix. The general form for the present network is $$\begin{bmatrix} A \end{bmatrix} = \begin{bmatrix} \frac{Z_2}{Z_1} + (1+\frac{Z_2}{Z_1}) \cdot (1+\frac{Z_2}{Z_3}) & Z_2 \cdot (2+\frac{Z_2}{Z_3}) \\ 1+\frac{Z_2}{Z_1}) \left[\frac{2}{Z_1} + \frac{1}{Z_3} \cdot (1+\frac{Z_2}{Z_1})\right] & \frac{Z_2}{Z_1} + (1+\frac{Z_2}{Z_1}) \cdot (1+\frac{Z_2}{Z_3}) \end{bmatrix}$$

The individual expression $Z_1$, $Z_2$, $Z_3$ are impedances in the branches of the symmetrical network and mean in the present case:

$$Z_1 = j\omega L$$

$$Z_2 = 1/j\omega C = 1/j\omega C_1$$

$$Z_3 = 1/j\omega aC = 1/j\omega Cq$$

With the simplifications $$\Omega = \omega_o/\omega, \text{ whereby } \omega_o = 1/\sqrt{LC}$$

is the coefficients of the matrix can be stated as follows $$a_{11} = a_{22} = (1+a) - \Omega^2 \cdot (2+a)$$

$$a_{12} = \Omega\ (2+a)\ 1/j\omega_o C$$

$$a_{21} = (1-\Omega^2)\ [a/\Omega - \Omega(2+a)] \cdot j\omega_o C$$

By introducing the source and load resistor $R$, the transfer function or its reciprocal value can be stated.

$$G = U_1^*/U_2 = 2a_{11} + R \cdot a_{21} + a_{12}/R$$

$$= 2\ (1-\Omega^2)\ (2+a) - 2+j\{\omega_o RC \cdot (1-\Omega^2)\ [a/\Omega\ (1-\Omega^2) - 2\Omega] - \Omega/\omega_o RC\ (2+a)\}$$

As only a small frequency region near the resonant frequency $\omega o$ is of interest, the following simplifications are admissible:

$$\Omega = 1 - b/2;\ \Omega^2 = 1-b$$

wherein $b$ means bandwidth. Therefore neglecting small values $G$ becomes $$G = 2ab - 2 + j[\omega_o RC(ab^2 - 2b) - a/\omega_o RG] =$$

Real part Re + imaginary part Im $Re = 0$ furnishes the band boundary $\omega_{-1}$; $\omega_{+1}$, respectively. It follows b = 1/2 by which amount now a coordinate transformation is carried out with the following substitution.

$$b = b^* + 1/a$$

$$Re = 2a\ (b^* + 1/a) - 2 = 2ab^*$$

$$Im = \omega_o RC\ (ab^{*2} - 1/a) - a/\omega_o RC$$

For damping the value of G is of importance, so that the damping function can be represented as follows:

$$\left|\frac{U_1^*}{U_2}\right| = \sqrt{(2ab^{*2}) + \left[\omega_0 RC\left(ab^{*2} - \frac{1}{2}\right) - \frac{a}{\omega_0 RC}\right]^2}$$

The obtained damping function of the filter depends on a, which is significant for the bandwidth. Because for $b=1/a$, the reciprocal value of the transfer function becomes imaginary by which the bandwidth boundaries $\omega_{-1}$, $\omega_{+1}$ are set. (See corresponding coordinate transformation).

Figure 5:
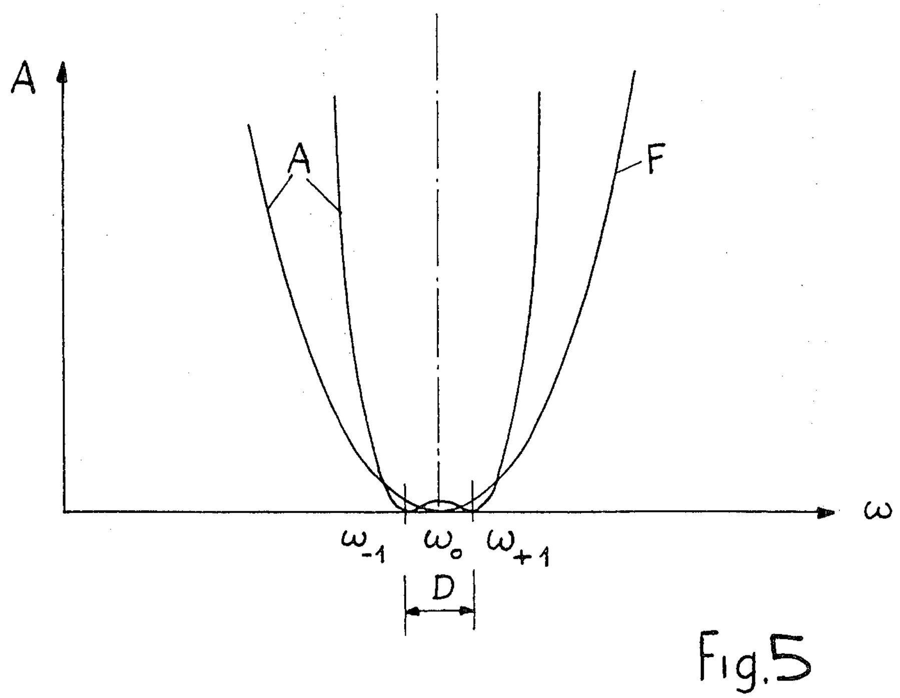
FIG. 5 illustrates the damping characteristics of the electromechanical resonator system.

Otherwise, the form and the position of the damping curves shown in FIG. 5 are set by the selection $\omega_o = 1 \sqrt{LC}$, R and C. R determines the ripple in the pass-band D and the steepness F. With L and C the lower pass boundary of the band-pass filter is set and the bandwidth is determined alone by the ratio a of the shunt capacity ($Z_3$) and the series capacity ($Z_2$).

This interesting fact is an important advantage of the band-pass filter according to the invention. If the above mentioned analogy between mechanical and electrical systems is considered, one sees immediately that the factor determining the bandwidth $$a = Z_3/Z_2 = C_q/C_1 = m/M$$

is nothing else than the mass relationship given by the active mass $M$ of the base member 1 and the rigidly mounted parts thereon and the mass $m$ of the resonators of the electromechanical filter. As practically the largest part of the mass $m$ is formed by the magnet systems 7 and 9, the described filter offers a simple possibility to determine the bandwidth $b$ thereof exactly and to keep it in production within narrow limits.

It must be stated that the derived relationships were made on the basis of a symmetric reciprocal quadripole. This means that they are valid for an electromechanical filter of the kind shown which is also of symmetrical design and whose magnetic systems 7 and 9 together with the respective springs 11 and 13 have the same mass m.

One could also change the characteristics of the band-pass filter by an asymmetric design of the electromechanical filter to obtain different damping curves A.

Such an asymmetric filter can also be calculated with the derivations shown.

An embodiment of the invention designed according to the above mentioned findings will now be described in detail. As FIG. 1 shows, the central mass M comprises basically the base member 1. The base member 1 must be freely movable. If, for its suspension in the interior of a housing 15, cushions 17 of resilient material are provided, as shown in FIG. 2, this means, that the active mass M is resiliently connected with the stationary frame or housing 15. In the electrical analogy model this corresponds to a relatively large inductance parallel to the impedance $Z_3$, the reactance of which may be neglected with respect to $Z_3$, which corresponds to the supposition made. As suitable material for the cushion 17, a foam material or foam rubber can be provided. It is also possible to provide a suspension of the base member 1 in the housing 15 by means of a plurality of small helical springs distributed around the base member 1. A simple suspension can also be provided by mounting the resonator system at the base member by means of three rods 51, 53, 55 (FIG. 1) of relatively small cross-section and accordingly high relative resilience. It is also possible to mount the base member at the side distant from the oscillating masses 7 and 9 by means of a leaf spring 57 (FIG. 3) at the housing 15. The leaf spring 57 is mounted at the symmetry axis of the supported mass, that is the base member 1, and in such a way that the oscillation plane of the mass coincides practically with the oscillation planes of the resonators.

Figure 3:
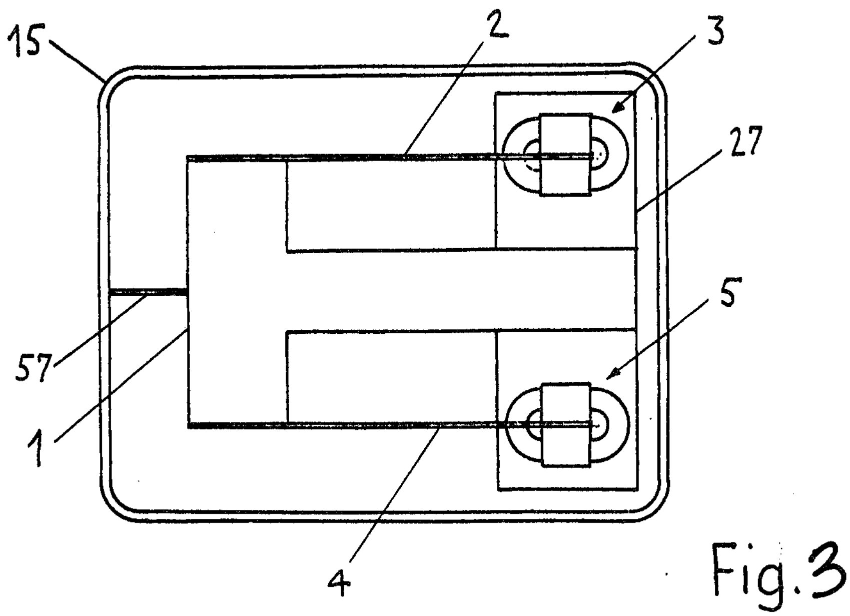
FIG. 3 shows a view of an embodiment on which the suspension of the resonator system takes place by a leaf spring.

In the embodiments shown in FIGS. 1 to 3, the base member 1 has the form of a T. This has an advantage in that the base 33 (FIG. 1) of the T the electrodynamic transducers 3 and 5 can be mounted in a simple fashion, as will be described later. The T form is not mandatory. For the determination of the active mass M of the base portion 1 and the rigidly mounted parts thereon, it is only necessary that the instantaneous center of the exited oscillation can be defined. With the help of the moment of inertia $\theta$ with respect to this instantaneous center Z, and the effective distance r, the active mass in each case is derived as $$M = \theta/r^2$$

If the relative bandwidth should be such that a relatively large coupling mass would be required, this formula suggests keeping the coupling mass nevertheless as small as possible by locating the largest part of the coupling mass in the region of the moving line of the oscillation centers of gravity of the two resonators.

The spring elements 11 and 13 are symmetrically mounted on both arms 19, 21 of the T-formed base member 1, so that they extend in parallel toward the base 33 of the T. The connection can be made by screws, glueing, welding, riveting or bracing, and must be rigid. The spring elements 11 and 13, together with the magnet systems 7 and 9 form the two resonators 2 and 4, which are coupled together by the base member 1, that is the suspended mass.

Figure 6:
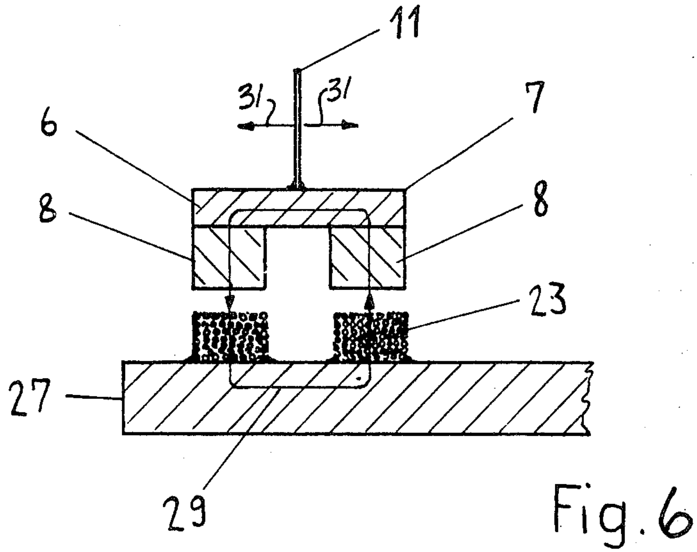
FIG. 6 is a cross sectional view through an electrodynamic transducer, taken along the line I—I of FIG. 1.

In order that these resonators 2 and 4 have a small mass with respect to the force of the transducer, the oscillation mass m is preferably concentrated at the free ends of the springs 11 and 13 in the form of the magnet systems 7 and 9. The magnet systems 7 and 9 preferably comprise a plate 6 (FIG. 6) of low remanence soft magnetic material on which two prismatic permanent magnets 8 are mounted. The magnets are preferably made of a samarium cobalt alloy. The axis of magnetization of the permanent magnets 8 extends approximately perpendicular to the plate 6. The permanent magnets 8 are arranged in such a way that a magnetic path 29, as shown in FIG. 6 is created. It would also be possible to create a magnet system of one piece, if a magnetic path 29 of the form shown in FIG. 6 could be created.

High stability of the band-pass filter characteristics and temperature independence of the parameters ($\omega_o$, $\omega_{-1}$, $\omega_{+1}$) is assured by suitable selection of such materials as those commercially known under such names as Elinvar, NiSpan C, Thermelast, and by suitable thermic treatment of these materials.

The coupling in and out of oscillation energy to and from an oscillation mass $m$ is desirable and corresponds to the coupling of electrical systems such as oscillators, conductors, amplifier stages etc. The electrodynamic transducers 3 and 5 are provided for this purpose and comprise the magnet systems 7 and 9 as the main movable part, and the flat coils 23 and 25 as the less movable part. The flat coils 23 and 25 are directly glued to a common plate of soft magnetic material and are located under the respective magnet system 7 or 9, so that they are optimally cut by the magnetic field lines of the magnet system. The plate 27, comprising a soft magnetic material, e.g. ferroxcube, carries at its ends the flat coils 23 and 25, and is rigidly mounted at the base 33 of the T of the base member 1.

FIG. 6 shows one exemplary construction of a transducer. The arrangement of the magnet system 7, the flat coil 23 and the plate 27 is clearly visible. The magnetic path 29 is very short on this arrangement, which provides for a high efficiency of the transducer. The spring element 11 oscillates with the permanent magnet system 7 periodically in the direction of the arrows 31, and induces by flux changes in the flat coil 23 corresponding voltage variations which can be fed to a load R (FIG. 4). The mechanical system 7 and 11, that is the resonator, can also be brought into oscillation by an alternating current supplied to the flat coil 23 from a source with an internal resistance R.

The electrodynamic transducers 3 and 5 may be considered as practically ideal and the source impedance and the load impedance are included into the computed installed load value R. Losses of the electrodynamic transducers 3 and 5 can be easily considered by external resistances R to be provided. The high quality factor of the electromechanical filter shown -values of some thousands can easily be obtained at low frequencies (100 to 1000 hertz) - makes it practically possible to build the band-pass filter in all applications into the circuit with unchanged characteristics. As previously explained, this is a great advantage of the present electromechanical band-pass filter. In the preferred region of application, that is in the lower low frequency region it is, in contrast to pure electrical filters, possible to obtain small dimensions. The described band-pass filter has external dimensions of only a few centimeters whereas electrical band-pass filters for the same frequencies, if they can be realized, can only be realized with inductances on large cores and condensers of large volume. In contrast to these electrical band-pass filters which have only a low quality factor which is for filter purposes not usable, the present band-pass filter has in the same frequency region a very high quality factor. This provides for an especially good selectivity so that this filter is particularly well suited for selecting low frequency utilization signals from a frequency mixture of high noise level or high external voltage level.

Figure 7:
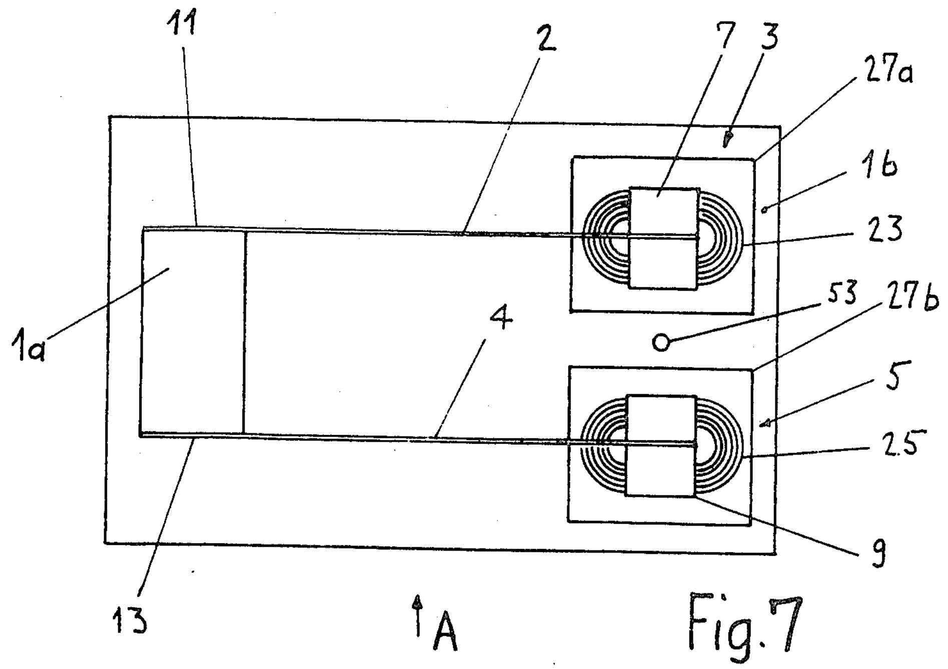
FIG. 7 shows a view of a further embodiment, of the electromagnetic resonator system of the band-pass filter.
Figure 8:
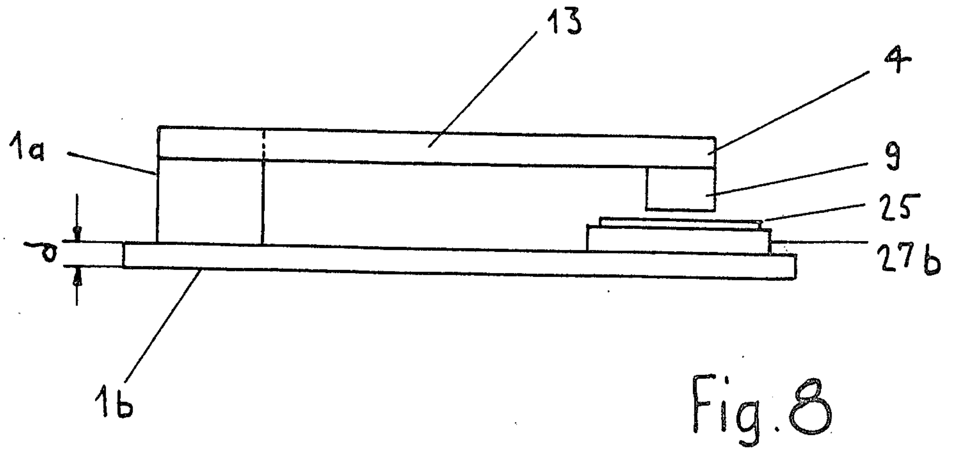
FIG. 8 is a view, taken in the direction of arrow A, of the system of FIG. 7.

The embodiment of the electromagnetic resonator system of a band-pass filter shown in FIGS. 7 and 8 differs from the previously described embodiments in that instead of a T-shaped base portion, a base portion is employed which comprises a prismatic base element 1*a* and a base plate 1*b*. The prismatic base element 1*a* can, for example, be fastened on the base plate 1*b* by soldering. Furthermore, in the embodiment according to FIGS. 7 and 8, instead of a single ferrite plate for both flat coils of the transducers, two separate plates 27*a*, 27*b* are provided which also comprise a soft magnetic material, such as, for instance, ferroxcube.

Otherwise the design of the band-pass filter according to FIGS. 7 and 8 is in principle the same as in the band-pass filter according to FIG. 1. Accordingly, the same reference numerals are used to designate like parts in the two embodiments.

Now considering the already mentioned features of the present embodiment in more detail, it is first mentioned that the described design of the base portion in the form of a base element 1*a* and a base plate 1*b* has an advantage in that, by selection of the thickness d of the base plate, it is possible to set the bandwidth for each desired frequency. It is also possible to design the plate 1*b* in such a way that it is possible to easily remove parts of the base plate. Further, it is possible to obtain a corresponding change of the bandwidth by adding additional masses on the base plate. The active mass can also be changed in such a way that the above mentioned additional mass is located differently on the base plate.

Now considering the use of separate plates 27*a* and 27*b* for the flat coils 23 and 25 of the transducers, this arrangement has an advantage in that on each resonator the flat coil, which is preferably glued to the plate 27*a* or 27*b* can be shifted on each resonator 2 or 4 exactly and independently from the other resonator to the correct location under the magnet system. Preferably the fastening of the plate 27*a*, 27*b* on the base plate a is carried out by glueing.

Considered as a whole, the described embodiment of the invention, on series production of different filters requiring different band-pass frequencies and different band-width, permits operation with standard elements. Such standard elements are, for instance, the coils, the plates for the coils, the permanent magnets, the yoke plates for the permanent magnets, the prismatic base portion for fastening the leaf springs, leaf springs of different thickness but equal width, and base plates of different thickness or base plates with removable parts, and eventually also additional mass parts for increasing the mass of the base plate.

As has already been stated in the introduction, the present invention comprises also a method for tuning the described band-pass filter. In order to tune a resonator, for instance resonator 2, the whole band-pass filter is mounted rigidly at the base portion 1 and is connected with its own transducer 7, to a feed back amplifier and operated as an oscillator. The oscillation frequency of the resonator is measured by suitable means. By means of a suitable device, e.g. a small cylindrical cutter or a grinding disc 58 (FIG. 1) with small diameter, the cross-section of the leaf spring 11 is reduced during oscillation of the oscillator at a position near the base member 1 until the desired frequency of the resonator is obtained. As soon as one resonator 2 of the filter has been tuned in this way, the tuning of the other resonator 4 is made in a corresponding way. This method of tuning makes it possible to tune the individual resonators to the desired lower pass frequency without the need to remove the respective resonators from the band-pass filter during tuning.

I claim:

1. An electromechanical band-pass filter comprising:

a support means;

a coupling mass resiliently suspended from said support means;

first and second resonator means each in the form of a leaf spring having one end rigidly fixed to said coupling mass and being provided at its free end with a plate of low remanence magnetic material to which is attached a pair of permanent magnets arranged with their magnetic axes orthogonal to the plate and to the direction of principal oscillation of said resonators;

each said plate with its magnets constituting the main portion of the mass of each resonator and at the same time comprising a part of an electrodynamic transducer;

a further part of said electrodynamic transducer being comprised in each case of a plate of low remanence magnetic material fixed to the coupling mass so as to form a part thereof and bearing thereon a coil having its axis parallel to the magnetic axes of said permanent magnets;

said coils and said permanent magnets being separated by an air gap, the arrangement being such that the magnetic lines of force flow in opposite directions through diametrically opposed portions of said coil underlying said permanent magnets.

2. An electromechanical band-pass filter as claimed in claim 1 wherein said first and second resonator means are symmetrically arranged about a central axis of said coupling mass.

3. An electromechanical band-pass filter as claimed in claim 1 wherein the greatest portion of said coupling mass is located as close as possible to a line connecting the centers of mass of said first and second resonators.

4. A band-pass filter as claimed in claim 1 wherein the coils are flat coils.

5. A band-pass filter as claimed in claim 1 wherein the coils of both transducers are mounted on the same plate.

6. A band-pass filter as claimed in claim 1 wherein the resiliently suspended coupling mass comprises a base member in the form of T, said base member having a base and two arms for attachment of the leaf springs.

7. A band-pass filter as claimed in claim 1 wherein abutments are provided to limit the oscillation amplitude of the resonators.

8. A band-pass filter as claimed in claim 1 wherein the resiliently suspended coupling mass comprises a base member for fastening of the spring elements and a ground plate connected with the base element.

9. A band-pass filter as claimed in claim 8 wherein the ground plate comprises separable parts for changing the bandwidth by replacing one of said separable parts.

10. A band-pass filter as claimed in claim 8 wherein an adjustable mass part is provided on the base plate for changing the bandwidth.

11. A band-pass filter as claimed in claim 8 wherein the coil of each transducer is connected to a single plate of soft magnetic material.

12. A band-pass filter as claimed in claim 11 wherein each plate of soft magnetic material is connected to a base plate.

13. A band-pass filter as claimed in claim 1 wherein the resilient suspension of the coupling mass is accomplished by providing a resilient mounting in a housing.

14. A band-pass filter as claimed in claim 13 wherein the resilient mounting of the resiliently suspended coupling mass is accomplished by a cushion.

15. A band-pass filter as claimed in claim 13 wherein the natural frequency of the cushion mass together with the total mass of the resonate system is lower than the lowest band-pass frequency.

16. A band-pass filter as claimed in claim 13 wherein the resilient mounting is accomplished by means of rods of narrow cross-section.

17. A band-pass filter as claimed in claim 13 wherein the resilient mounting is accomplished by at least one spring element.

18. A band-pass filter as claimed in claim 17 wherein the spring element is a leaf spring.

19. A band-pass filter as claimed in claim 18 wherein the leaf spring is mounted on the symmetry axis on the suspended coupling mass at the bottom of the resonators, and the plane of oscillation of the leaf spring coincides with the planes of oscillation of the leaf springs of the resonators.

20. A method of manufacturing a band-pass filter of the type claimed in claim 1 said method being characterized in that for tuning the band-pass filter to a desired frequency of a predetermined bandwith, the complete band-pass filter is rigidly held at its coupling mass, and that the cross-section of one or the other leaf spring respectively, when said leaf spring is operated by the associated transducer as an oscillator, is reduced in cross-section at one location until the lower pass frequency is obtained by the respective resonator.

21. A method as claimed in claim 20 wherein the coupling mass of the band-pass filter is mounted on a block of substantially higher mass during said reducing step.

22. A method as claimed in claim 20 wherein reduction of the cross-section of the leaf spring is accomplished by a material removing operation.

23. A method as claimed in claim 22 wherein the material removing operation is accomplished by grinding or milling.

24. A method as claimed in claim 20 wherein the reducing of the cross-section of the leaf spring takes place near or at its attachment to the coupling mass.

25. A band-pass filter as claimed in claim 2 wherein the resiliently suspended coupling mass comprises a base member in the form of a T, said base member having a base and two arms for the attachment of the leaf springs.

26. A band-pass filter as claimed in claim 3 wherein the resiliently suspended coupling mass comprises a base member in the form of a T, said base member having a base and two arms for attachment of the leaf springs.

27. A band-pass filter as claimed in claim 26 wherein both resonators are connected symmetrically with their leaf springs at the arms of the base member, said springs extending together symmetrically toward the base.

* * * * *